(12) United States Patent
Kim et al.

(10) Patent No.: US 8,373,259 B2
(45) Date of Patent: Feb. 12, 2013

(54) OPTICAL CONNECTION THROUGH SINGLE ASSEMBLY OVERHANG FLIP CHIP OPTICS DIE WITH MICRO STRUCTURE ALIGNMENT

(75) Inventors: Brian H. Kim, Fremont, CA (US); Simon S. Lee, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 311 days.

(21) Appl. No.: 12/844,656

(22) Filed: Jul. 27, 2010

(65) Prior Publication Data

US 2012/0025209 A1    Feb. 2, 2012

(51) Int. Cl.
*H01L 23/02*    (2006.01)
*G02B 6/26*    (2006.01)

(52) U.S. Cl. .......... 257/678; 257/725; 257/727; 385/39; 385/49; 385/88; 385/92

(58) Field of Classification Search ............... 257/678, 257/725, 727; 385/39, 49, 50, 88, 92
See application file for complete search history.

(56) References Cited

U.S. PATENT DOCUMENTS

| 6,344,664 | B1 * | 2/2002 | Trezza et al. | 257/82 |
|---|---|---|---|---|
| 6,628,854 | B1 | 9/2003 | Koh et al. | |
| 6,686,216 | B2 * | 2/2004 | Trezza et al. | 438/24 |
| 7,373,052 | B2 * | 5/2008 | Nadeau et al. | 385/50 |
| 2003/0026081 | A1 * | 2/2003 | Liu et al. | 361/760 |
| 2006/0006321 | A1 | 1/2006 | Sherrer et al. | |
| 2006/0159403 | A1 | 7/2006 | Cheng et al. | |

OTHER PUBLICATIONS

International Search Report and Written Opinion from PCT/US2011/045486, mailed Feb. 28, 2012, 9 pages.

* cited by examiner

*Primary Examiner* — Long Tran
(74) *Attorney, Agent, or Firm* — Blakely, Sokoloff, Taylor & Zafman LLP

(57) ABSTRACT

A system includes an optical transceiver assembly, including a flip chip connection of a semiconductor die with a photonic transceiver that overhangs a substrate to which it is to be connected. The assembly further includes an alignment pin that is held to the semiconductor die at a micro-engineered structure in the semiconductor die. The alignment pin provides passive alignment of the photonic transceiver with an optical lens that interfaces the photonic transceiver to one or more optical channels.

15 Claims, 8 Drawing Sheets

OPTICAL CONNECTION THROUGH SINGLE ASSEMBLY OVERHANG FLIP CHIP OPTICS DIE WITH MICRO STRUCTURE ALIGNMENT

FIELD

Embodiments of the invention are generally related to optical connectors, and more particularly to passive alignment connections between optical components.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2010, Intel Corporation, All Rights Reserved.

BACKGROUND

Traditional optical transceivers include optical transceiver components, such as a photo diode and VCSEL (vertical cavity surface emitting laser), and a mechanically fixed optical lens. The fixing of the lens has been time consuming, and has been expensive and technically challenging to achieve the precision desired for optical connectors. The lack of precision is one reason that limits the applicability of optical connectors to smaller form factors. The transceiver assembly has traditionally been a time consuming and cumbersome process which generally requires several manufacturing steps, including: die placement, wire-bonding, lens placement, epoxy curing, and possibly others. Additionally, the alignment of resulting assemblies is traditionally "active," where light is sent through the fibers during the manufacturing process to align the connectors, to be able to achieve the necessary precision to comply with standards tolerances.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

As described herein, an assembly includes an optical transceiver with flip chip connection contacts, a die overhang over a connecting substrate, and alignment features that act to passively align the optical components. In one embodiment, the alignment features include one or more alignment pins in the assembly that interface with a micro-engineered structure in the optical transceiver semiconductor die to achieve precision alignment of the alignment pin(s), which in turn allow for precise passive alignment with corresponding optical components (e.g., an optical lens). Thus, passive alignment can be used to achieve standards tolerance compliance.

With micro structures in the optical transceiver semiconductor die, alignment can be more specific to the particular die. Increased alignment specificity with respect to a particular die can further be achieved, for example, if the micro structure(s) are processed right into/onto the optical transceiver semiconductor die during processing of the semiconductor die. Alignment features incorporated onto the semiconductor die can improve precision of the alignment without the need for complicated manufacturing as previously done. By providing the alignment mechanisms up front in the manufacturing process (e.g., integrating passive alignment with the semiconductor die), the expense and time required for manufacturing an optical transceiver assembly can be reduced.

Additionally, with the use of flip chip connections of the optical transceiver semiconductor die with a substrate, a much lower profile and/or form factor can be achieved. Processing steps related to wire bonding may be eliminated entirely. The passive alignment of the optical lens to the optical transceiver allows for the optical lens to be connected later in the manufacturing process than traditionally allowed. Thus, solder reflow processes can be used on the semiconductor die and other components with the lens added later. Such an approach prevents warping or damage to the lens, while still ensuring proper alignment of the optical lens.

As described in more detail below, a semiconductor die having a photonic transceiver on it includes one or more grooves or other micro structure(s) on the semiconductor die. In one embodiment, the groove is processed onto the semiconductor die with processing that creates one or more components of the photonic transceiver. Thus, the groove can be precisely aligned with respect to a facet of an optical mode or waveguide of the photonic transceiver.

One or more alignment pins or posts (which may also be referred to as a guide pin or post) interface with a corresponding groove to extend away from the semiconductor die to provide a passive alignment feature for a resulting finished optical transceiver assembly including the semiconductor die, substrate, and alignment pin(s). A support mechanism can be included to hold the alignment pin against the semiconductor die at the groove.

Figure 1A:
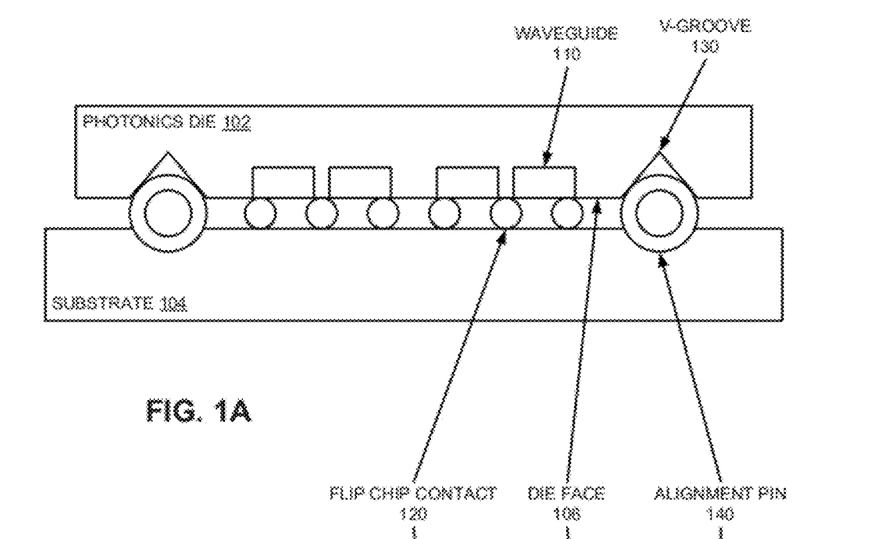
FIGS. 1A and 1B illustrate different perspectives of a block diagram of an embodiment of a photonic transceiver assembly that overhangs a substrate and includes an alignment pin and a groove.
Figure 1B:
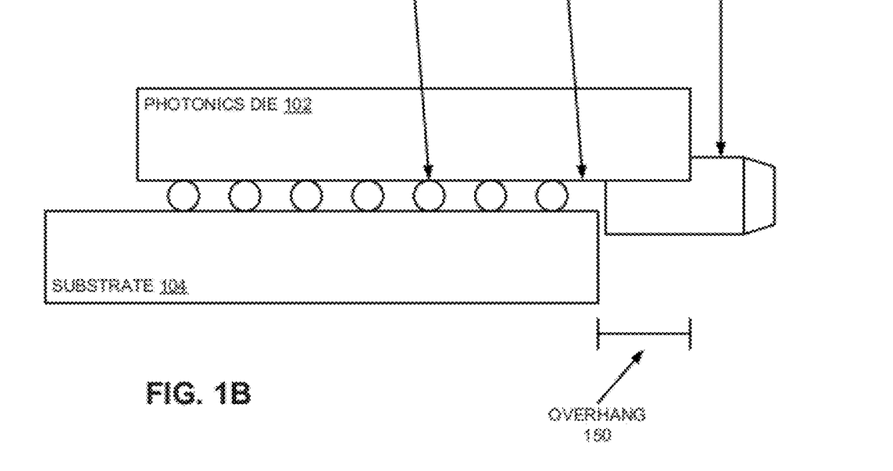

FIGS. 1A and 1B illustrate different perspectives of a block diagram of an embodiment of a photonic transceiver assembly that overhangs a substrate and includes an alignment pin and a groove. Referring first to FIG. 1A, photonics die 102 includes V-groove 130. Photonics die 102 represents a semiconductor (e.g., silicon, SiGe, or any of a variety of III-V combinations) die with optical transceiver circuitry processed into and/or onto the die. The optical transceiver circuitry includes electronics that generate one or more waveguides 110 in an active mode. The waveguide(s) may be considered "active areas" of the die, and are generated at or near the surface or face of the semiconductor die on which the circuitry is processed. Such a surface may be considered the face of the die nearest the waveguide.

V-groove 130 is one example of a micro structure or micro-engineered structure. Other types of structures could include the use of posts (e.g., a series of posts in a line) or walls (e.g., an elongated structure protruding out of the face of the semiconductor die, or the opposite of a groove) to which an alignment pin could be aligned. V-groove 130 may be processed onto the semiconductor die, for example, by etching or by making the groove with a sawing blade. Additionally, precision processing through the use of laser cutting could be used to create a groove. Posts or walls could be created by growing crystalline structures or by processing away material to leave micro structures.

In one embodiment, V-groove 130 is etched into the semiconductor bulk of photonics die 102. In one embodiment, the groove is processed into photonics die 102 with a photolithographic process used to create one or more components of the optical electronics circuitry. Thus, the groove may be processed with same techniques used to create the circuitry. Such a groove would be lithographically aligned with a waveguide facet of the photonics. The waveguide facet is the face or edge of the die from which light is transmitted or at which light is received during operation of the photonics transceiver. Alignment of the groove with the waveguide facet allows for precision alignment of the alignment pin with the actual processed waveguide, rather than a theoretical or designed placement.

Photonics die 102 generates and/or receives light when operating. As is understood by those skilled in the art, the areas of light generation or reception may be referred to as waveguides or optical modes or active optical regions. Photonics die 102 includes one or more waveguides 110. While four waveguides are shown in the drawing, the number of waveguides is not significant to the subject matter discussed herein, and could be any number.

Photonics die 102 is to be bonded to substrate 104, which may also be referred to as a package substrate. Substrate 104 allows the packaging of the photonics die, and may include interconnection of the photonics die to power and potentially other components (other electrical connectivity). In contrast to the traditional wire bonding techniques to interconnect photonics to a substrate, photonics die 102 is flip chip connected to substrate 104. As is understood in the art, flip chip connection involves turning a processed semiconductor integrated circuit (IC) over to be connected to a substrate on the same face one which circuitry was processed. Thus, face 106 of photonics die 102 is the face that was processed to generate the circuitry, and is the face on which (or near which) waveguide 110 will be active. Face 106 is also the face that includes contacts to interconnect to substrate 104.

It will be understood that photonics die 102 is generally used in connection with other circuit components, such as processing units that cause the photonics die (i.e., the optical transceiver) to transmit optical signals and/or to receive and process optical signals received via the optical transceiver. Thus, contacts on photonics die 102 will correspond to contacts on substrate 104 to make designed interconnections. Flip chip contact 120 represents a contact or a connection between substrate 104 and photonics die 102. In one embodiment, contact 120 is a solder ball that connects a contact of photonics die 102 to a corresponding contact on substrate 104. For purpose of discussion, contact 120 represents any and all parts of the interconnection.

It will be understood that photonics die 102 can be reflow soldered to substrate 104 because there is no risk of deforming the optical lens when the lens is not connected or otherwise integrated onto the photonics. The optical lens does not have to be joined with the photonics yet because of the alignment features discussed herein.

Alignment pin 140 represents an alignment feature of the optical transceiver assembly (e.g., photonics die 102, substrate 104, and alignment mechanisms such as V-groove 130 and pin 140). Alignment pin 140 contacts photonics die 102 at V-groove 130. Thus, alignment pin 140 contacts the micro structure of photonics die 102 along a long axis of the pin. It will be understood that alignment pin 140 could be multi-faceted or a circle, with the body being generally cylindrical (or rectangular).

Referring to FIG. 1B, photonics die 102 is mounted on substrate 104 to overhang the substrate. It is common in IC processing for a substrate to be larger in surface area than the semiconductor die, and thus the substrate may be considered to "overhang" the die. However, as seen in FIG. 1B, photonics die 102 is mounted on substrate 104 with the die overhanging the substrate. Overhang 150 represents an amount of photonics die 102 that overhangs off the edge of substrate 104.

It will be seen that V-groove 130 "points" off the edge of substrate 104 over which photonics die 102 overhangs. Thus, a long axis of V-groove 130 (and alignment pin 140 that interfaces with V-groove 130) extends over the edge of substrate 104 on face 106 of photonics die 102 that hangs over the edge of substrate 104. Alignment pin 140 contacts or abuts against photonics die 102 within overhang 150 at V-groove 130. In one embodiment, alignment pin 140 abuts against substrate 104, although contact between the substrate and the alignment pin is not required.

In one embodiment, alignment pin 140 has a diameter or cross-section length greater than a width of the groove, or at least great enough to prevent alignment pin 140 from fitting completely within V-groove 130. Thus, in one embodiment V-groove 130 (or other micro structure) is designed and manufactured to have a space between the semiconductor die and the alignment pin. More detail as to the securing of an alignment pin to a semiconductor die is provided below.

It will be understood that the various details are emphasized in the drawings, and are not intended to be shown to scale. Rather, the drawings serve only for purposes of illustrating the components and features of the system, and do not necessarily illustrate ratios or dimensions.

While certain details have been described with specific reference to FIGS. 1A and 1B, it will be understood that the details may provide non-limiting examples. In general, a semiconductor die with optical circuitry overhangs a connecting substrate, and includes micro structures and an alignment pin to passively align the optical transceiver with an optical channel.

The techniques described herein allow a low profile optical package, which may be implemented with a BGA interconnect. By overhanging the flip chip semiconductor die and performing the passive alignment via the micro structure and guide pin, an optical package can be created without requiring additional height. In one embodiment, the waveguide(s) correspond to edge emitting laser(s) or edge detector(s) on the photonics die. The overhang portion allows the use of the alignment pins in the middle of the package. It will be understood that both the alignment mechanism (through the alignment or guide pins) and the waveguides are located at the middle of the package, which reduces the height needed to implement the optical transceiver. By overhanging the micro structure alignment features, the space between a circuit board on which the optical transceiver is to be installed can be used for pins and pin support. Advantages: waveguide based organic package concept, and passive alignment.

In addition to the overhang and the micro structure alignment, the optical lens and optical fiber coupling can also be improved over traditional methods. Unlike traditional mechanically fixed optical lenses, in one embodiment an optical lens is to float between an optical connector and an optical transceiver device, as discussed in more detail below, and as seen, for example, in FIG. 7. The optical lens engages using the alignment pins or alignment features positioned during the optical transceiver attachment process.

As discussed herein, an optical connector assembly and an optical lens are pre-assembled, which can reduce time and complexity related to lens assembly. Additionally, optical components do not have to go through an IR reflow process. Finally, as described herein, coupling to the fibers can be simplified by reducing or removing the need to polish optical fibers; rather, a fiber can be installed into a housing right after a clean cleaving.

Figure 2:
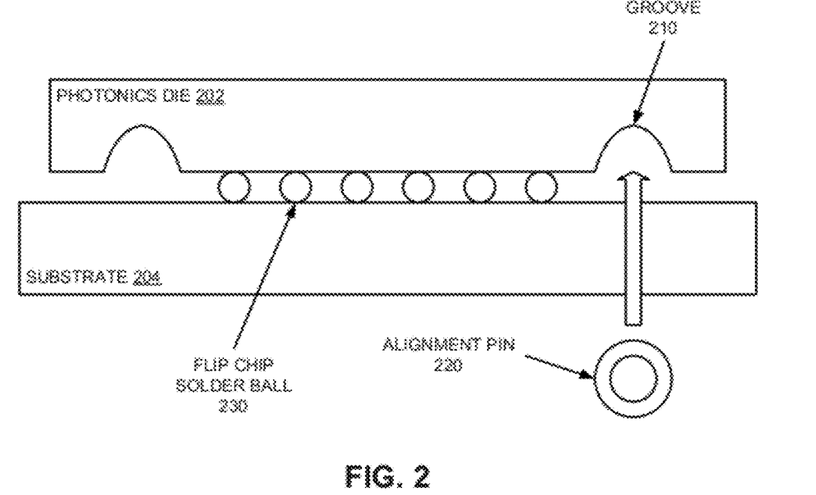
FIG. 2 is a block diagram of an embodiment of a photonic transceiver assembly with a groove for an alignment pin.

FIG. 2 is a block diagram of an embodiment of a photonic transceiver assembly with a groove for an alignment pin. Photonics die 202 includes groove 210, which has a "U" shape. Compare U-groove 210 to V-groove 130 of FIG. 1. When a groove is used as an alignment feature in a semiconductor die, the shape can be a V-shaped or a U-shaped trench. A U-shaped trench is understood to include a trench having a more squared-off or rectangular cross-section, in addition to the smoother U shape depicted in the drawings.

Additionally pointed out is that the contact interconnect between a semiconductor die and a substrate could be or include solder balls, as indicated by flip chip solder balls 230. Thus, photonics die 202 may be connected to substrate 204 via solder balls 230. It will be understood that the number of contacts shown in the drawings is arbitrary in the sense of showing features. The number of contacts needed will be understood to depend on the functionality of the assembly and the interconnections needed in the system to utilize the photonics.

Alignment pin 220 is shown "unset," with an arrow indicating that the pin is to be positioned in contact with photonics die 202 at groove 210. The U shape cross section of groove 210 indicates that the area of the cross section of the trench of groove 210 will not completely contain alignment pin 220. Thus, the alignment pin, even when positioned, will leave space between it and photonics die 202. The edge of alignment pin 220 will not touch the "deepest" part of the trench of groove 210, where depth is considered in relation to an orthogonal distance away from the face of photonics die 202 in which the groove exists.

Figure 3:
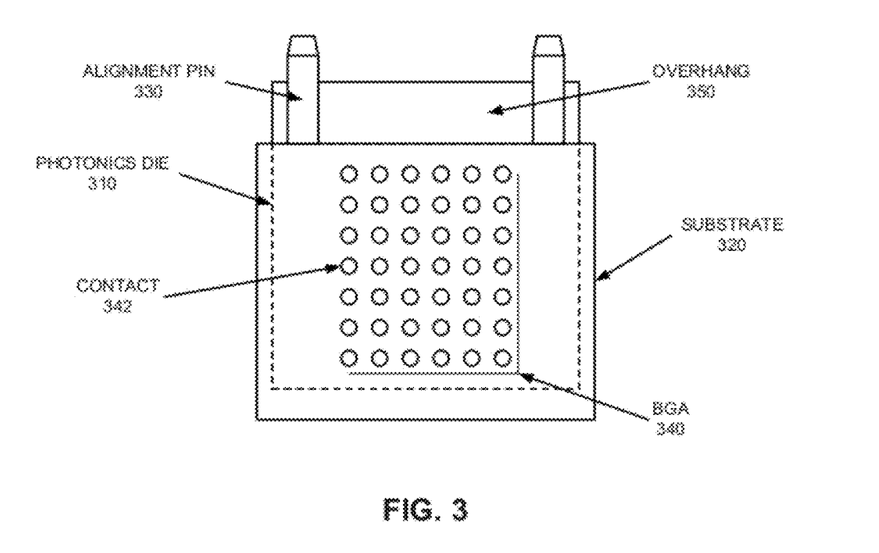
FIG. 3 is a block diagram of an embodiment of a photonic transceiver assembly with a groove for an alignment pin with a ball grid array (BGA) connection to a substrate.

FIG. 3 is a block diagram of an embodiment of a photonic transceiver assembly with a groove for an alignment pin with a ball grid array (BGA) connection to a substrate. With respect to the drawings of FIGS. 1 and 2, FIG. 3 illustrates a "bottom" view, with photonics die 310 being furthest into the page, and next alignment pin 330 and BGA 340, and finally substrate 320.

Alignment pin 330 is an example of what is discussed above, where the alignment pin contacts photonics die 310 at grooves (not seen). The grooves may or may not extend along photonics die 310 to the area where photonics die 310 and substrate 320 overlap. At the least, the grooves (or other micro structures) exist in photonics die 310 in overhang area 350 to allow for the setting of alignment pin 330 (and possibly other alignment pins).

Photonics die 310 and substrate 320 are interconnected by BGA 340, which includes an array of contacts 342. In one embodiment, substrate 320 has a larger area than photonics die 310, and the overhang is solely for purposes of alignment. Thus, substrate 320 may extend beyond the area of photonics die 310 in all other edges except where overhang 350 exists.

Figure 4A:
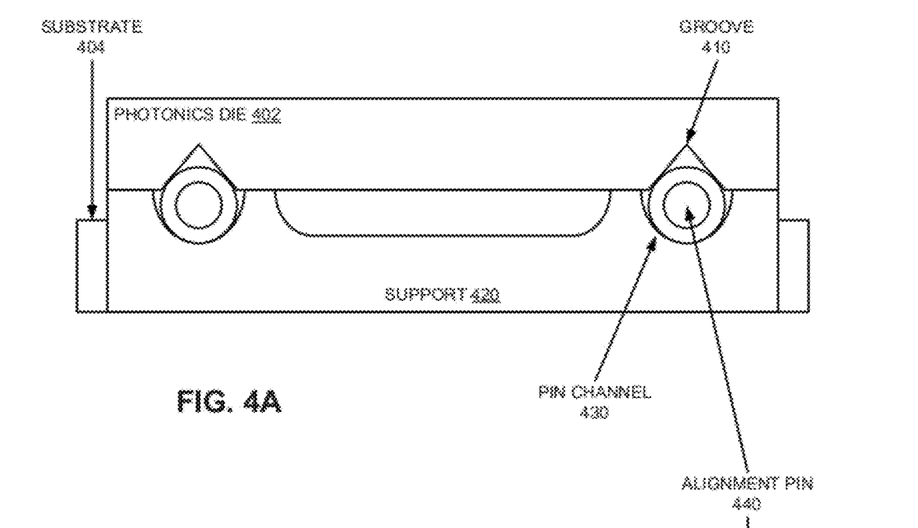
FIGS. 4A and 4B illustrate different perspectives of a block diagram of an embodiment of a photonic transceiver assembly with a groove for an alignment pin with a support to hold the alignment pin to the photonics die.
Figure 4B:
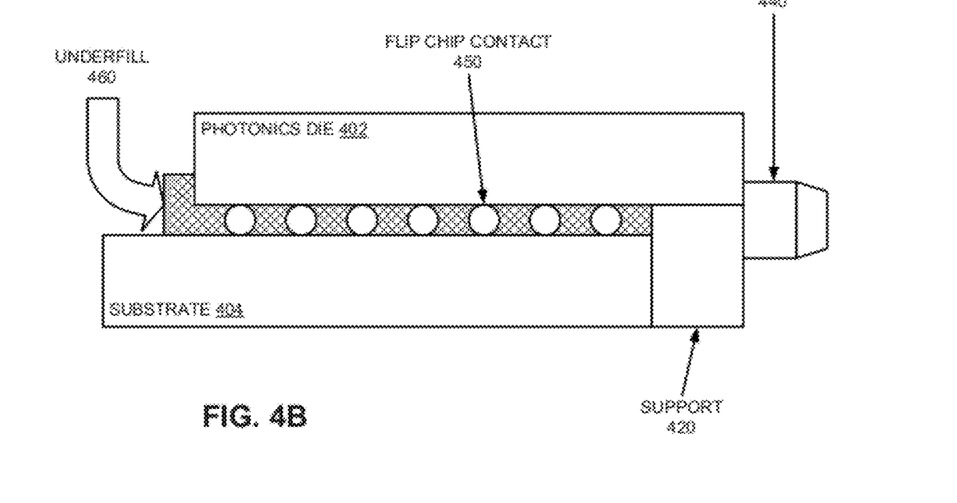

FIGS. 4A and 4B illustrate different perspectives of a block diagram of an embodiment of a photonic transceiver assembly with a groove for an alignment pin with a support to hold the alignment pin to the photonics die. FIGS. 4A and 4B are similar, respectively, to FIGS. 1A and 1B, discussed above. FIGS. 4A and 4B further illustrate embodiments including support 420 and underfill 460.

Photonics die 402 includes groove 410, against which is set alignment pin 440. Substrate 404 is illustrated behind support 420 from the view of FIG. 4A. Support 420 holds alignment pin 440 in place against photonics die 402 at groove 410. Support 420 includes pin channel 430, which includes a depression in the support where alignment pin 440 is to be held between groove 410 and support 420. In one embodiment, pin channel 430 has a trench or depression width greater than the diameter of alignment pin 440, to allow the pin to sit fully within the depression. A bonding material is used to secure support 420 in place, and thus secure alignment pin 440 in place.

In one embodiment, the bonding material includes underfill 460 as shown in FIG. 4B. Underfill (such as an epoxy) can fill the gaps between the contacts (i.e., the space between photonics die 402 and substrate 404, including between the contacts), as well as the space around alignment pin 440. The space around alignment pin 440 is the space between the alignment pin and the substrate, the space between the alignment pin and the support, and the space between the alignment pin and the photonics die. When the underfill material sets or cures, photonics die 402, substrate 404, support 420, and alignment pin 440 are adhered together as a single module assembly.

Figure 5:
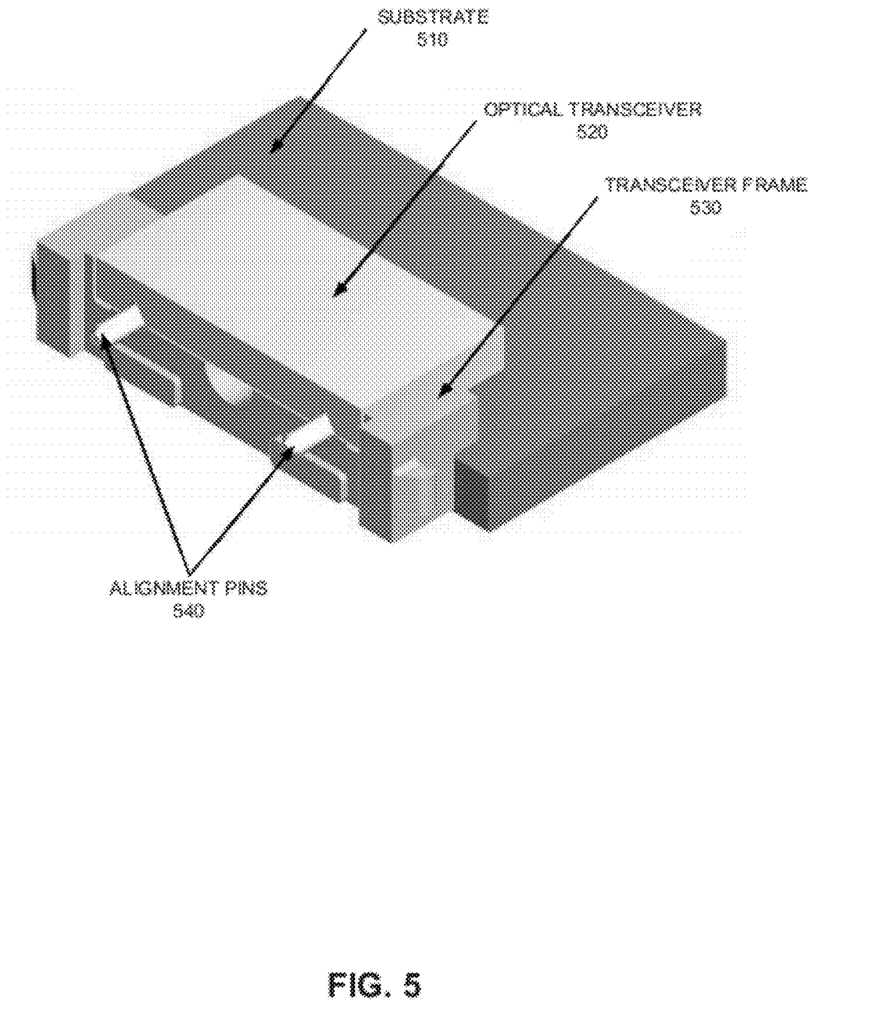
FIG. 5 is a block diagram of an embodiment of a photonic transceiver assembly with an alignment pin to interface to a free space optical lens.

FIG. 5 is a block diagram of an embodiment of a photonic transceiver assembly with an alignment pin to interface to a free space optical lens. The result of binding all the assembly components together is illustrated. Substrate 510 is a substrate as illustrated above. Optical transceiver 520 is a photonics die as illustrated above. Alignment pins 540 allow for passive alignment of optical transceiver to an optical channel. Substrate 510 further includes transceiver frame 530, which frames the assembly and allows for the connection of the assembly to a fiber assembly that includes one or more fiber channels. In one embodiment, the support that holds alignment pins 540 in place is part of transceiver frame 530. However, it is not necessarily a unitary piece.

It will be observed that the optical transceiver is a single, pre-assembled module that can be interfaced with an optical lens. The joining of an optical lens to the assembly is discussed in more detail below with respect to FIGS. 6 and 7.

FIGS. 6A-6E illustrate an embodiment of preparing an optical connector that interfaces with a photonic transceiver assembly through an optical lens. In one embodiment, the interfacing occurs through an optical lens cable assembly that includes an optical lens, an optical jumper connector, and a connector latch.

Figure 6A:
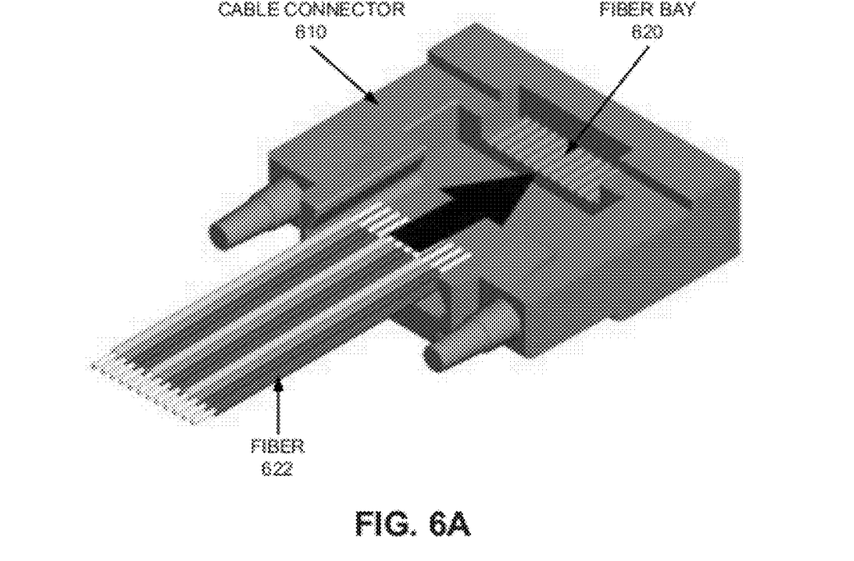
FIGS. 6A-6E illustrate an embodiment of preparing an optical connector that interfaces with a photonic transceiver assembly through an optical lens.

Referring to FIG. 6A, cable connector 610 provides a location to mount one or more fibers 622. It will be understood that the techniques described herein could be used for a single fiber, but could also be applied to fiber cables including 4, 8, 12, or 16 fibers or more. Cable connector 610 may be considered the base of an optical jumper connector. Connector 610 includes fiber bay 620, which is where fiber 622 is to be installed. In one embodiment, cable connector includes guide holes for each fiber 622 that will be installed. Fiber bay 620 may include channels or depressions in which each fiber will lie.

Figure 6B:
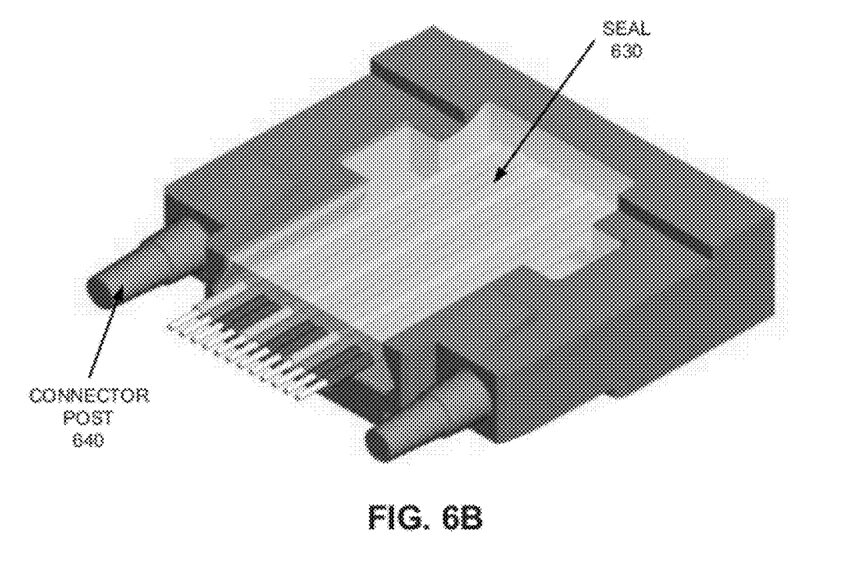

Referring to FIG. 6B, once stripped and cleaned fibers (which do not necessarily have to be polished) are inserted into cable connector 610, and seal 630 is applied. Seal 630 may be, for example, an epoxy. Connector 610 also includes connector post 640 on the side of connector 610 opposite fiber bay 620.

Figure 6C:
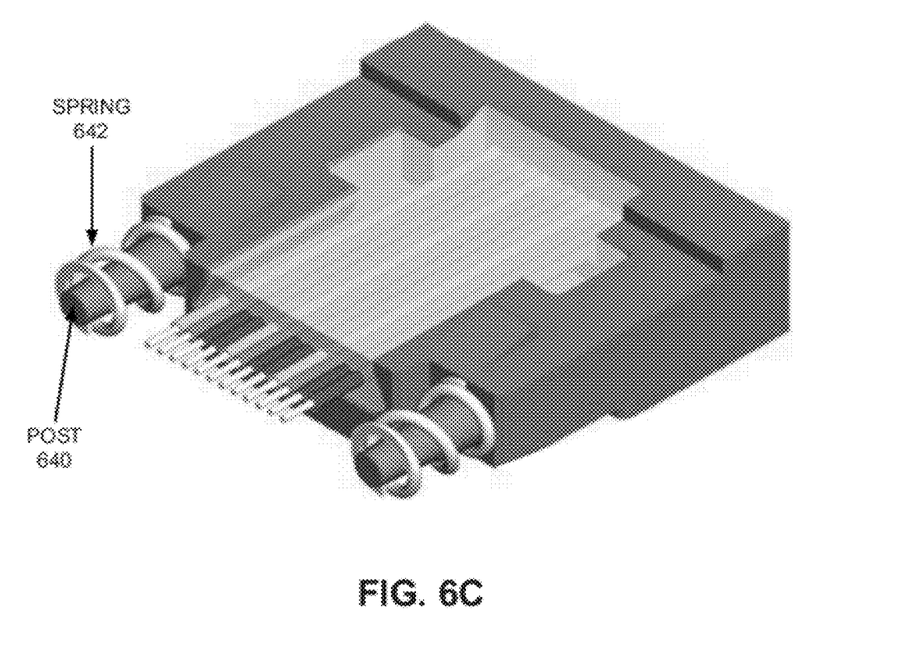
Figure 6D:
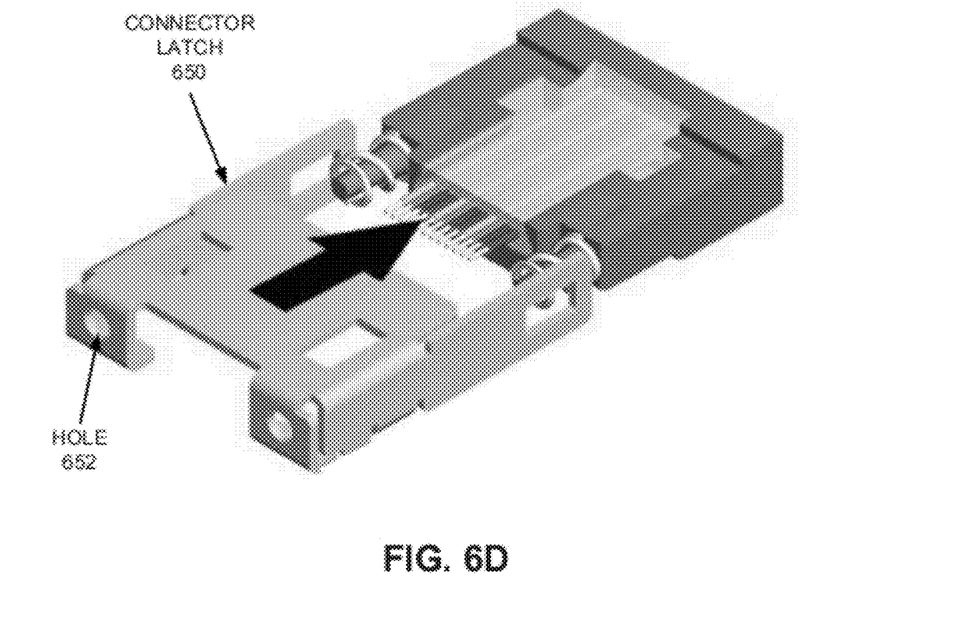

Referring to FIG. 6C and FIG. 6D, once the fibers are installed and the epoxy has cured, the optical latch is installed. Spring 642 is installed on post 640, and the connector is inserted into connector latch 650. Connector latch 650 provides a constant spring force for the optical lens cable assembly to be butted against the optical transceiver, via spring 642. Connector latch 650 includes hole 652 to allow movement of post 640 through the hole, to allow for compression and decompression of spring 642.

Figure 6E:
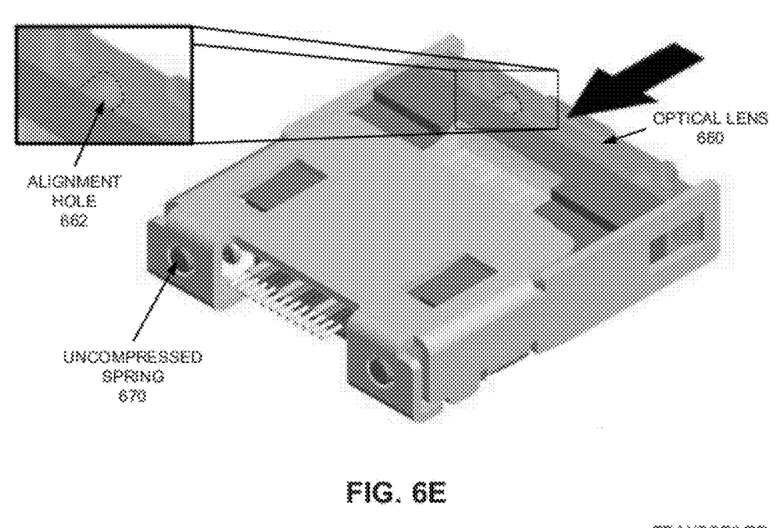

Referring to FIG. 6E, compression hole 652 is illustrated with uncompressed spring 670. When the spring is compressed, the post 640 will protrude through the hole in the latch (i.e., compression hole 652; for example, see 730 of FIG. 7). Once the connector latch is installed, the floating optical lens 660 is inserted to the optical jumper connector. In one embodiment, optical lens 660 includes a latch to interface with a corresponding latch hook of the connector latch.

Optical lens 660 includes alignment hole 662, as shown in the blow-up of the highlighted region of the drawing. Alignment hole 662 corresponds to the alignment pin discussed previously. Namely, an alignment pin on the optical transceiver assembly is to be inserted into alignment hole 662 of the optical lens cable assembly. Additionally, the mating of the fiber connector and optical lens 660 can be accomplished passively through similar techniques. For example, the fiber connector may have a hole or post, and the lens have a mating post or hole. It will be understood that reference to a hole and a corresponding post may also be applied to other types of recessing notch and corresponding protrusion. Thus, the fiber connector and the optical lens mate with passive alignment to provide alignment from the fibers to the optical circuitry.

Optical lens 660 is to interface with the photonic transceiver of the optical transceiver assembly. The alignment hole and the spring force provided by compression of the spring passively align the alignment pin in the mating gap (the hole) in the optics lens. In one embodiment, the optics lens comprises a free-space optics lens that expands (collimates) and focuses optical signals between the waveguide and an optical fiber channel.

Figure 7:
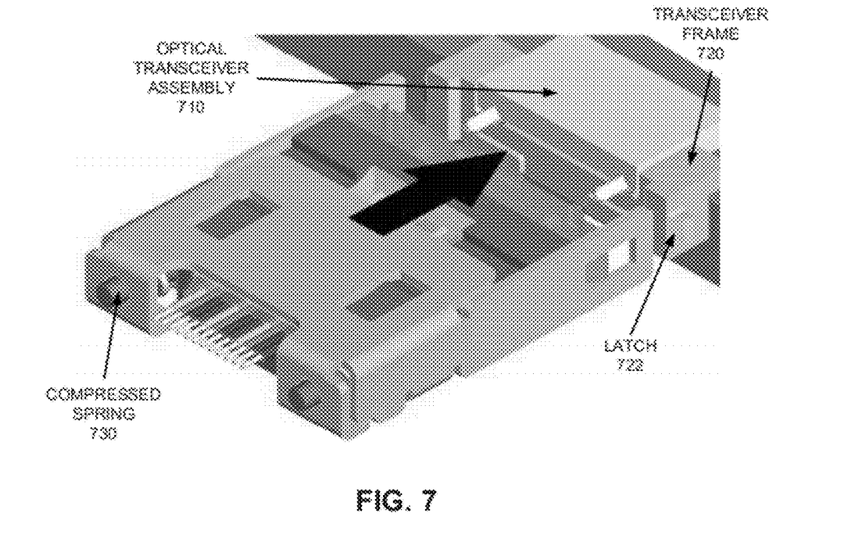
FIG. 7 is a block diagram of an embodiment of an optical connector that interfaces with a photonic transceiver assembly through an optical lens aligned and secured via a spring force.

FIG. 7 is a block diagram of an embodiment of an optical connector that interfaces with a photonic transceiver assembly through an optical lens aligned and secured via a spring force. The cable assembly of FIG. 6 can be joined with the optical transceiver assembly. Both the optical transceiver and the cable assembly are pre-assembled, and a lens is inserted between the two, and a passive alignment occurs in the connection. Using the latching mechanism on optical transceiver assembly 710, the connector latch on the optical lens cable assembly is installed. In one embodiment, the optical lens cable assembly connector latch connects to latch 722 of transceiver frame 720, and is mechanically secured through the combination of the latching and the spring force from compressed spring 730.

Figure 8:
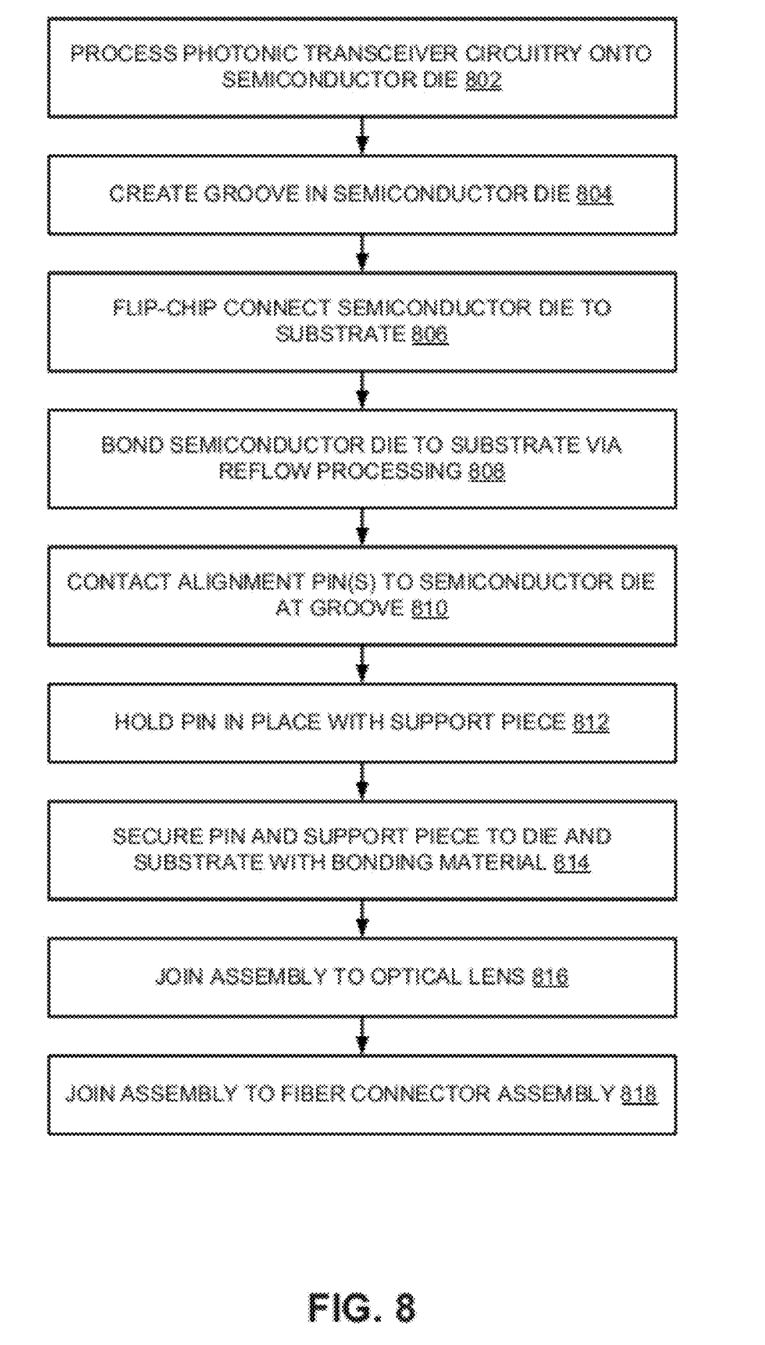
FIG. 8 is a flow diagram of an embodiment of a process for preparing a photonic transceiver assembly.

FIG. 8 is a flow diagram of an embodiment of a process for preparing a photonic transceiver assembly. Flow diagrams as illustrated herein provide examples of sequences of various process actions, which may be performed by processing logic that may include hardware, software, or a combination. Although shown in a particular sequence or order, unless otherwise specified, the order of the actions can be modified. Thus, the illustrated implementations should be understood only as an example, and the process can be performed in a different order, and some actions may be performed in parallel. Additionally, one or more operations can be omitted in various embodiments of the invention; thus, not all actions are required in every implementation. Other process flows are possible.

An optical transceiver assembly is created from an optical IC or a semiconductor die with photonic transceiver circuitry processed onto the die. The entity that processes the circuitry onto the die is not necessarily the same entity that generates the optical transceiver assembly. However, at some point, photonic transceiver circuitry is processed onto a semiconductor die, and the die prepared for use in the assembly, 802.

Either as a separate process, or as part of the process of creating the photonic transceiver circuitry onto the semiconductor die, one or more grooves are processed onto the semiconductor die, 804. Alternatively, other micro structures could be used, as described above. As also described above, an advantage to creating the groove at the same time as the circuitry is to have greater precision in alignment of the groove with the waveguide facet.

The semiconductor die with the photonic circuitry and micro-engineered groove is flip chip connected to a substrate, 806. The substrate may provide electrical connectivity, heat transfer, mechanical structure, or other functions for the semiconductor die. When the die is flip chip connected, the groove on the semiconductor die is to be facing the substrate, and a face of the semiconductor face nearest the waveguide (e.g., active area) of the photonic transceiver circuitry is to be facing the substrate.

Flip chip connecting the semiconductor die includes positioning the semiconductor die with a waveguide facet and a groove overhanging the substrate. When the semiconductor die is properly placed, the semiconductor die is bonded to the substrate via reflow processing, 808. With the semiconductor die bonded to the substrate, the alignment pins are contacted to the semiconductor die at corresponding grooves, 810.

The alignment pins are held in place or secured by a support piece, 812. The alignment pins are then secured to the semiconductor die and the substrate with a bonding material, 814. In one embodiment, securing the alignment pins to the semiconductor die includes adhering the alignment pins to the semiconductor die via an underfill process that inserts underfill bonding material between the semiconductor die and the substrate and around the alignment pin to the semiconductor die.

The resulting assembly is a transceiver assembly. In one embodiment, the transceiver assembly can then be joined to an optical lens, 816. The optical lens is a floating lens that is passively aligned with the alignment pins on the transceiver assembly, and is held in place on the transceiver assembly via a spring force. In one embodiment, the optical lens is part of a cable assembly or fiber connector assembly that couples to the transceiver assembly, 818.

To the extent various operations or functions are described herein, they may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communication interface to send data via the communication interface. A machine readable storage medium may cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus comprising:
   a package substrate to provide a packaging mount for a photonic transceiver;
   a semiconductor die including photonic transceiver circuitry, the semiconductor die to be flip-chip bonded to the package substrate, the semiconductor die to overhang the package substrate on an edge of the semiconductor die to be active in an optical mode of the photonic transceiver, the semiconductor die having a groove processed in semiconductor bulk of the semiconductor die to face the package substrate when the semiconductor die is bonded to the package substrate;
   an alignment pin to contact the semiconductor die at the groove and extend beyond the semiconductor die away from the package substrate to provide passive alignment of the optical mode of the photonic transceiver to an optical lens; and
   a support to hold the alignment pin to the semiconductor die at the groove.

2. The apparatus of claim 1, wherein the groove comprises:
   a groove etched into the semiconductor bulk with a photolithographic process used to create one or more components of the circuitry.

3. The apparatus of claim 2, wherein the groove comprises a groove lithographically aligned with a waveguide facet of the circuitry.

4. The apparatus of claim 1, wherein the groove comprises a V-shaped trench.

5. The apparatus of claim 1, wherein the alignment pin is to abut against the semiconductor die at the groove within the overhang of the semiconductor die.

6. The apparatus of claim 5, wherein the alignment pin has a diameter greater than a width of the groove, and wherein the support has a depression where the alignment pin is to be held between the groove and the depression of the support.

7. The apparatus of claim 1, wherein the alignment pin is further to abut against the package substrate.

8. The apparatus of claim 1, further comprising:
   underfill bonding material to fill spaces between the semiconductor die, the package substrate, and the support, and around the alignment pin and the semiconductor die, to secure the package substrate, semiconductor die, alignment pin, and support together as a single module assembly.

9. The apparatus of claim 1, further comprising:
   an optics lens to interface with the photonic transceiver, the optics lens to interface with the photonic transceiver with a spring mechanism, passively aligned with the alignment pin in a mating gap in the optics lens.

10. The apparatus of claim 9, wherein the optics lens comprises a free-space optics lens that expands and focuses optical signals between the optical mode and an optical fiber.

11. An apparatus comprising:
    a semiconductor die including photonic transceiver circuitry, the semiconductor die including a ball-grid array (BGA) contact interface on a face of the semiconductor die nearest a waveguide of the transceiver circuitry, the semiconductor die to be flip chip bonded by the BGA contact interface,
       the semiconductor die having a micro-engineered structure to interface with an alignment pin, the micro-engineered structure being on the face of the semiconductor die nearest the waveguide, the semiconductor die to overhang a substrate to which the semiconductor die is to be flip chip bonded;
    an alignment pin to contact the semiconductor die at the micro-engineered structure and extend beyond the semiconductor die away from the overhang, the alignment pin to provide passive alignment of the waveguide of the photonic transceiver to an optical lens; and
    a support to hold the alignment pin to the semiconductor die at the micro-engineered structure.

12. The apparatus of claim 11, wherein the micro-engineered structure comprises a groove processed into the semiconductor die.

13. The apparatus of claim 12, wherein the groove comprises a V-shaped or a U-shaped trench.

14. The apparatus of claim 11, further comprising:
underfill bonding material to adhere the semiconductor die to the substrate, and the alignment pin to the semiconductor die.

15. The apparatus of claim 11, further comprising:
an optics lens to interface with the photonic transceiver, the optics lens to interface with the photonic transceiver with a spring mechanism, passively aligned with the alignment pin in a mating gap in the optics lens.

* * * * *

UNITED STATES PATENT AND TRADEMARK OFFICE
CERTIFICATE OF CORRECTION

| | | |
|---|---|---|
| PATENT NO. | : 8,373,259 B2 | Page 1 of 1 |
| APPLICATION NO. | : 12/844656 | |
| DATED | : February 12, 2013 | |
| INVENTOR(S) | : Kim et al. | |

It is certified that error appears in the above-identified patent and that said Letters Patent is hereby corrected as shown below:

In the specification

Please insert in column 1, line 5

--STATEMENT OF GOVERNMENT INTEREST

This invention was made with Government support under contract number H98230-08-3-0011 awarded by the Department of Defense. The Government has certain rights in this invention.--

Signed and Sealed this
First Day of December, 2015

Michelle K. Lee
*Director of the United States Patent and Trademark Office*